(12) United States Patent
Beuten et al.

(10) Patent No.: US 7,313,703 B2
(45) Date of Patent: Dec. 25, 2007

(54) METHOD FOR PROTECTING A MICROCOMPUTER SYSTEM AGAINST MANIPULATION OF DATA STORED IN A STORAGE ASSEMBLY

(75) Inventors: Michael Beuten, Schwieberdingen (DE); Klaus Schneider, Ludwigsburg (DE); Bernd Illg, Eppingen (DE)

(73) Assignee: Robert Bosch GmbH, Stuttgart (DE)

( * ) Notice: Subject to any disclaimer, the term of this patent is extended or adjusted under 35 U.S.C. 154(b) by 129 days.

(21) Appl. No.: 10/187,815

(22) Filed: Jul. 1, 2002

(65) Prior Publication Data

US 2003/0018902 A1    Jan. 23, 2003

(30) Foreign Application Priority Data

Jul. 2, 2001    (DE)    ................................ 101 31 578

(51) Int. Cl.
*H04L 9/32*    (2006.01)
(52) U.S. Cl. .................... 713/187; 380/2; 713/189; 713/193; 726/17; 726/20; 726/30
(58) Field of Classification Search ......... 713/187–194
See application file for complete search history.

(56) References Cited

U.S. PATENT DOCUMENTS

| | | | | |
|---|---|---|---|---|
| 4,726,024 | A | * | 2/1988 | Guziak et al. ................ 714/24 |
| 4,933,969 | A | * | 6/1990 | Marshall et al. ............. 713/177 |
| 5,627,894 | A | * | 5/1997 | Albert et al. ................ 380/46 |
| 5,643,086 | A | * | 7/1997 | Alcorn et al. ................ 463/29 |
| 5,844,986 | A | * | 12/1998 | Davis ........................ 713/187 |
| 6,421,780 | B2 | * | 7/2002 | Tichenor ..................... 713/200 |
| 6,421,790 | B1 | * | 7/2002 | Fruehling et al. ............. 714/30 |
| 2002/0023223 | A1 | * | 2/2002 | Schmidt et al. ............. 713/187 |

FOREIGN PATENT DOCUMENTS

DE    197 23 332    9/1998

OTHER PUBLICATIONS

Rolina, T., 'Past, Present, and Future of Real-Time Embedded Automotive Software: A Close look at basic concepts of AUTOSAR', SAE international, 2005, entire document, http://www.etas.com/data/presentations/SAE2006_AUTOSAR_Rolina_2006-04-05.pdf.*
Sundaram, P., et al. 'Controller Integrity in Automotive Failsafe System Architectures', SAE International, 2006, entire document, http://delphi.com/pdf/techpapers/2006-01-0840.pdf.*

* cited by examiner

*Primary Examiner*—Nasser Moazzami
*Assistant Examiner*—Ronald Baum
(74) *Attorney, Agent, or Firm*—Kenyon & Kenyon LLP

(57) ABSTRACT

A method of protecting a microcomputer system against manipulation of data stored in a storage assembly of the microcomputer system, in particular a control program stored there. Checking mechanisms are executed at preselectable points in times to check for manipulation of the data. To achieve the most complete test coverage within an acceptable period of time in checking data stored in a storage assembly of a microcomputer system, the storage assembly is subdivided into multiple logic blocks, at least one of the blocks is selected and the checking mechanisms are executed only for the or each selected block of the storage assembly.

19 Claims, 2 Drawing Sheets

METHOD FOR PROTECTING A MICROCOMPUTER SYSTEM AGAINST MANIPULATION OF DATA STORED IN A STORAGE ASSEMBLY

FIELD OF THE INVENTION

The present invention relates to a method for protecting a microcomputer system against manipulation of data stored in a storage assembly of the microcomputer system. The data is in particular a control program stored in the microcomputer system. Checking mechanisms are executed at preselectable points in time to check for manipulation of the data.

The present invention also relates to a microcomputer system including a computer, in particular a microprocessor, including a storage assembly in which data, in particular a control program, may be stored, and including checking mechanisms executable at preselectable points in times to check for manipulation of data.

BACKGROUND INFORMATION

There are believed to be methods for protecting data stored in a storage assembly of a microcomputer system in other systems, in particular for protecting a control program stored there against manipulation. Such a method is referred to in, for example, German Published Patent Application No. 197 23 332. Such methods are, for example, used to prevent unauthorized manipulation of a control program stored in a control device of a motor vehicle or data stored from this program. The control program controls or regulates specific functions in the motor vehicle, for example an internal combustion engine, a driving dynamics regulator, a stop control system (SCS) or an electronic steering system (steer-by-wire). A defect in the controlled or regulated unit of the motor vehicle may occur due to a manipulation of the control program. Therefore, manipulation of the control program or the data is to be prevented, but the manipulation is at least to be detectable afterwards, so that the cause of a defect of a controlled or regulated unit may be established or so that warranty claims may be assigned properly.

In spite of the risks of manipulation of the control program or the data by unauthorized persons, it may not be advisable to forbid access to the storage assembly of the control device completely. In order to, for example, perform reprogramming of the control device, an authorized user group is able to access the storage assembly. Specifically, it may be necessary from time to time to store a new version of a control program or new parameters or limiting values in the control device in order to, for example, remove errors in the software or to take new legal requirements into account.

In automotive control devices, a distinction may be made between serial equipment and application equipment. Control devices may be shipped as serial equipment after manufacturing. In serial equipment, checking mechanisms for checking for manipulation of data stored in a storage assembly of the control device are activated. Manipulated data may be detected by these mechanisms and such data may be blocked. The mechanisms may be entirely different. Various checking mechanisms are referred to in other prior systems.

In certain situations, in particular during the development and testing phase of control devices, it may be necessary to deactivate the checking mechanisms so that various data may be stored in the storage assembly rapidly and easily. A control device including deactivated checking mechanisms may be referred to as an application device.

To be able to ensure complete test coverage of data stored in the storage assembly, the same data, in particular the same control program, is stored in the storage assembly of the control device in both the series case and the application case. Therefore, a control device may be switched from a series case to an application case without having to load other data into the storage assembly. Switching from the application case back to the series case may not be desirable and may even be impossible in order to prevent control devices, whose control program has not been tested and approved by the manufacturer of the control device, from being in circulation.

According to other systems, the checking mechanisms for checking the storage assembly may be activated in powering up the control device. If manipulation of data stored in the storage assembly is detected, this data is blocked. To achieve complete test coverage of the data, the checking mechanisms check the entire storage area of the storage assembly, which may under some circumstances take a certain amount of time. However, the amount of time available for powering up the control device, including checking the storage assembly, is not unlimited. Finally, after turning an ignition key or pressing a starter button (beginning of powering up the control device), the engine of the vehicle should start as soon as possible (end of powering up the control device). This means that as the size of the storage assemblies used in control devices increases, it becomes progressively more difficult, if not impossible, to check the entire storage area within an acceptable period of time.

SUMMARY OF THE INVENTION

Therefore, it is an object of the exemplary embodiment and/or exemplary method of the present invention to check data stored in a storage assembly of a microcomputer system within the shortest period of time while also achieving the most thorough test coverage.

The exemplary embodiment and/or exemplary method of the present invention provides that the storage assembly be subdivided into multiple logic blocks, at least one of the blocks be selected and the checking mechanisms be executed only for the or each selected block of the storage assembly.

According to the exemplary embodiment and/or exemplary method of the present invention, the method may allow checking of the storage area within an acceptable period of time even under unfavorable performance conditions between the computing power of a microprocessor of the microcomputer system and the size of the storage assembly. This is achieved by the fact that the entire storage area is not checked in activation of the checking mechanisms, but instead only a portion thereof is checked, namely at least one selected block. Various blocks of the storage assembly, i.e., different parts of the data may be checked on each activation of the checking mechanisms, i.e., each time the microcomputer system is powered up, so that at least approximately complete test coverage is achieved after repeated execution of the checking mechanisms.

In the exemplary embodiment and/or exemplary method of the present invention, the storage assembly is segmented into multiple logic blocks. The size of the blocks may be selected freely depending on performance conditions. The blocks should be at most large enough to allow them to be checked by the checking mechanisms within an acceptable period of time. The running time for checking the storage assembly is reduced drastically according to the block size selected. A check of the storage assembly may be executed, e.g., in powering up the microcomputer system.

The various blocks of the storage assembly may be selected according to a fixed selection algorithm or randomly with each execution of the checking mechanisms. When using a selection algorithm, exactly when complete test coverage is achieved may be predicted. In the case of a random selection of blocks, the test coverage may be determined with the help of a probability calculation. The checking mechanisms may be activated at any desired point in time. This may be, for example, before operation of the control device (in powering up the control device), during or after operation of the control device. The check of the storage assembly by the checking mechanisms is appropriately limited to those blocks in which data was in fact stored in the last reprogramming or new programming.

If manipulation of the data stored in the storage assembly, i.e., in the block checked, is detected in execution of the checking mechanisms, then the data stored in the storage assembly is at least partially blocked so that use of the data or execution of the control program is no longer allowed. To permit an orderly power down of the microcomputer system without any loss of data, after manipulation has been detected, a corresponding entry may be stored in a secret or non-writable storage area of the storage assembly, and otherwise continue to operate the microcomputer system normally. Under some circumstances, a warning may be issued to the user, e.g., the driver of a vehicle in which the microcomputer system is implemented as a control device. Then with any subsequent attempt to power up the microcomputer system, the entry will be checked and powering up of the system will be prevented. After a proper shutdown of the microcomputer system, this is blocked for the time being.

According to an exemplary embodiment of the present invention, the checking mechanisms are executed in powering up the microcomputer system.

According to an exemplary embodiment of the present invention, the at least one block of the storage assembly, for which the checking mechanisms are executed, is selected randomly. To do so, a random number, for example, may be generated in the microcomputer system and at least one block of the storage assembly for which the checking mechanisms are to be executed may be selected as a function of this random number.

Since generating a random number is not trivial in many microcomputer systems, according to another exemplary embodiment of the present invention, various manners for generating a random number are described. Firstly, it is a noise signal is read at an analog/digital (A/D) input of the microcomputer system and a random number be generated as a function of the noise signal. The A/D input supplies a random noise signal when it is unpowered. Secondly, a sum of the contents of the storage assembly may be formed and a random number is generated as a function of this sum. The contents of the storage assembly are disordered, or in other words, they are randomly ordered before powering up the microcomputer system. In addition, a timer inside the computer which is not reset in powering up the microcomputer system is read out and a random number is generated as a function of the status of the timer. Finally, a variable influenceable by a driver of a vehicle in which the microcomputer system is installed is used and a random number is generated as a function of this variable. As a variable influenceable by the driver, the position of an accelerator pedal or a variable of an adaptive driver's characteristics map may be used, for example.

According to another exemplary embodiment of the present invention, after execution of the checking mechanisms, an entry into a storage area of the storage assembly is stored in a write-protected and non-readoutable form, the storage area is erased in reprogramming or new programming of the storage assembly, and the entry is checked in powering up the microcomputer system. If in execution of the checking mechanisms, a manipulation of the data stored in the storage assembly is detected, a corresponding entry is provided. This entry may be stored in a secret storage area and/or in a read- and write-protected form to prevent manipulation of the entry. Each time the microcomputer system is powered up, manipulated data is detected by a corresponding entry. Then powering up the computer system may be terminated or a subsequent execution or use of the data may be blocked.

Also, the microcomputer system may include an arrangement for subdividing the storage assembly into multiple logic blocks for selection of at least one of the blocks and for execution of the checking mechanisms only for the or each selected block of the storage assembly.

According to an exemplary embodiment of the present invention, the microcomputer system may be configured as a control device for a motor vehicle for controlling and/or regulating automotive functions.

According to an exemplary embodiment of the present invention, the microcomputer system may include an arrangement for execution of the exemplary method according to the present invention. A computer program that is capable of running on the computer and is suitable for execution of the exemplary method according to the present invention is stored in the storage assembly.

The storage assembly is configured on the same semiconductor component as the computer. In the case of such on-chip storage, the program memory, i.e., the data stored in it, is not accessible to external manipulation, thus providing additional protection of the microcomputer system against manipulation of the data stored in the storage assembly.

DETAILED DESCRIPTION

Figure 1:
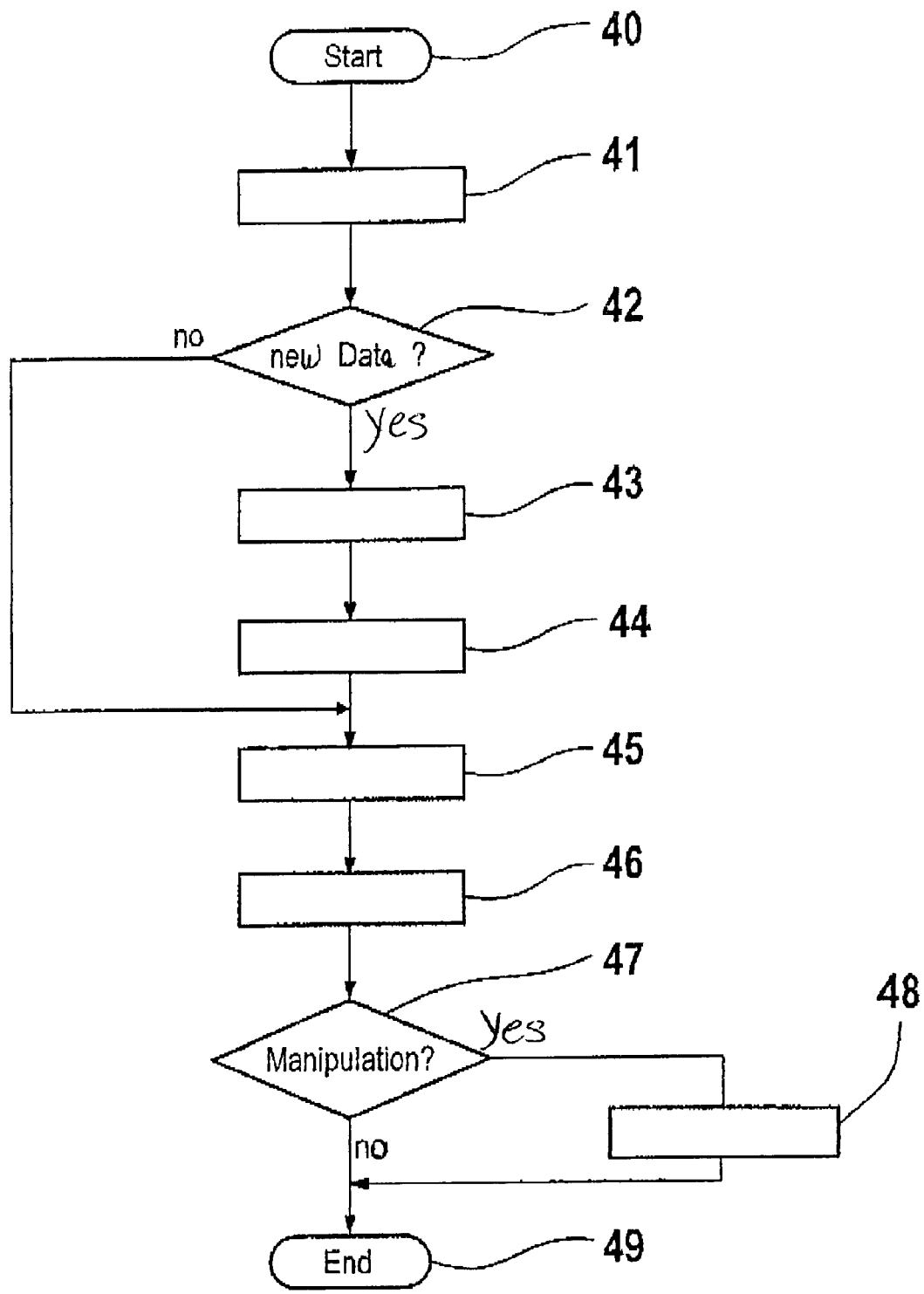
FIG. 1 shows a flow chart of an exemplary method according to the present invention.
Figure 2:
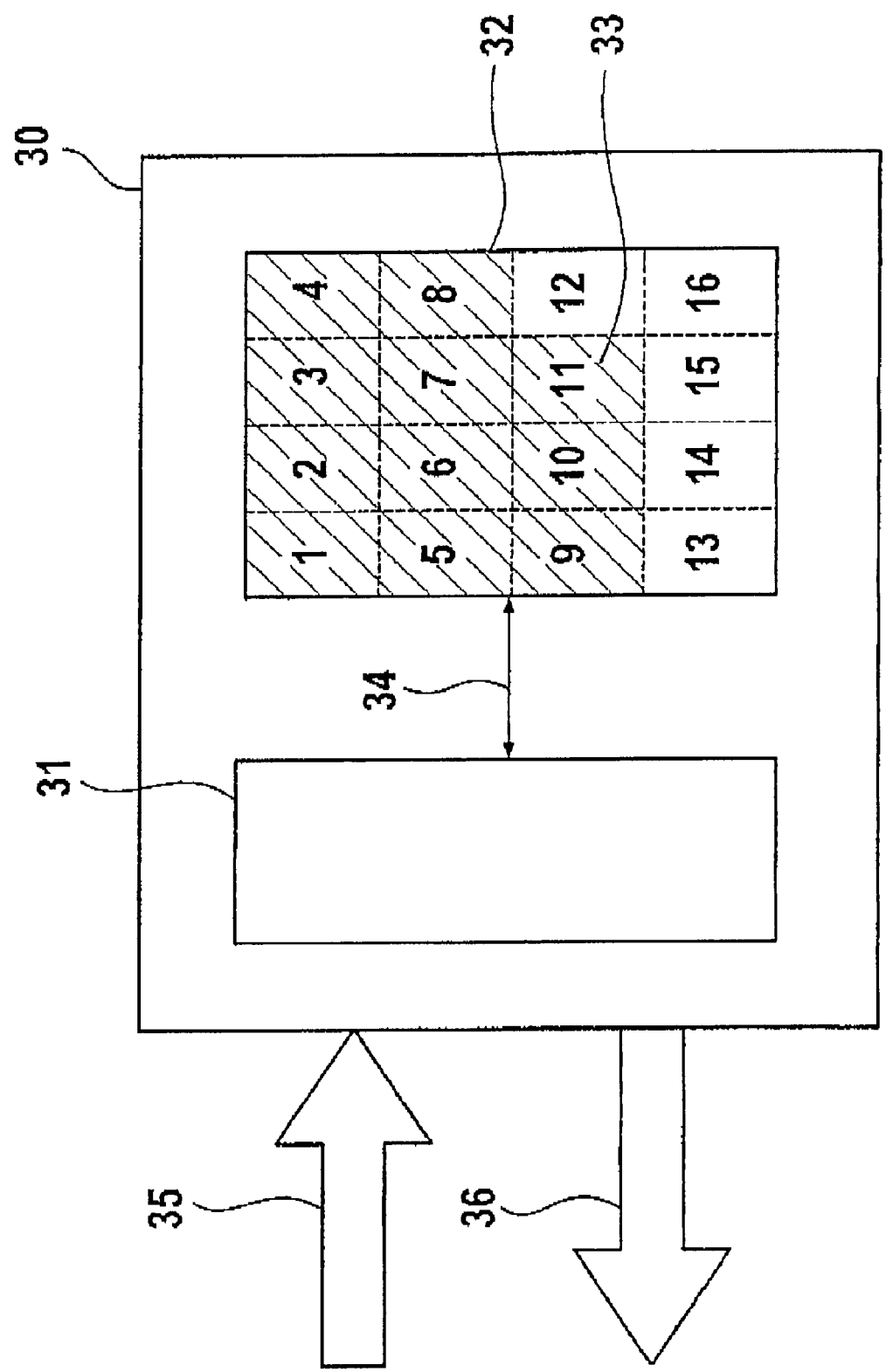
FIG. 2 shows an exemplary microcomputer system according to the present invention.

FIG. 1 shows a flow chart of an exemplary method according to the present invention for protection of a microcomputer system 30 from FIG. 2 against manipulation of data 33 stored in a storage assembly 32 of microcomputer system 30. Microcomputer system 30 is configured, e.g., as a control device in a motor vehicle for controlling and/or regulating certain automotive functions. Data 33 is embodied as a control program, as limiting values or as parameters, for example.

Control device 30 includes a microprocessor 31 for processing a control program 33 stored in storage assembly 32 and/or for processing data 33 stored there. To transmit data 33 from storage assembly 32 to microprocessor 31, a data transmission link 34 is provided between the processor and the memory. Data 33 is transmitted to microprocessor 31 incrementally or as a whole for processing. Results of calculations and the like are transmitted from microprocessor 31 to storage assembly 32. Storage assembly 32 is configured on the same semiconductor component as microprocessor 31 (on-chip storage). Sensor signals 35 from various sensors for detecting the status of the vehicle are sent to control device 30. Control device 30 determines output signals 36 for actuators for influencing the status of the vehicle from sensor signals 35 and as a function of the control program and data 33.

From time to time, it may be necessary to program anew or reprogram control device 30, i.e., data 33 stored in the storage assembly. Reprogramming or new programming may be necessary to store a new version of a control program or new parameters or limiting values in control device 30 in order to, for example, remove errors in the software or to take new legal requirements into account. For reprogramming or new programming, storage assembly 32 is first erased and then new data 33 is written to it.

New data 33 is checked for manipulation. This is done, for example, by suitable checking mechanisms, (e.g., forming a checksum) which are executed at preselectable times. Such checking mechanisms are referred to in other prior systems and will not be discussed in detail here.

The exemplary method according to the present invention as illustrated in FIG. 1 begins in a function block 40. In a function block 41, microcomputer system 30 is powered up, for example, by turning an ignition key in a motor vehicle in which microprocessor system 30 is installed as a control device or by pressing a starter button. In a query block 42, a check is performed to determine whether new data 33 for reprogramming or new reprogramming storage assembly 32 has been applied. If not, the sequence branches off to a function block 45.

However, if data 33 for new programming or reprogramming of storage assembly 32 has been applied, new data 33 is transmitted in a function block 43 to control device 30, where the data is stored in storage assembly 32. In a function block 44, storage assembly 32 is segmented into sixteen logic blocks 1 through 16. It is self-evident that the storage assembly may also be subdivided into more than or fewer than sixteen blocks. The number and size of blocks 1 through 16 may be selected as a function of the computing power of microprocessor 31 of microcomputer system 30 and the size of storage assembly 32, so that data 33 stored in a block for manipulation (function block 46) may be checked within an acceptable period of time without an unreasonable delay in the power-up operation.

In a function block 45, at least one of blocks 1 through 16 is selected. The selection of a block may be limited to those blocks 1 through 16 in which new data 33 has in fact been stored. The selection of a block may be random or it may be based on a defined algorithm. Then in a function block 46, data 33 stored in the at least one selected block is checked for manipulation. To do so, algorithms that are referred to in other prior systems, such as formation of a checksum, are used, but these need not be explained further here.

According to the exemplary embodiment and/or exemplary method of the present invention it is not necessary to check all data 33 stored in storage assembly 32 for manipulation when powering up microcomputer system 30, but instead only a portion of data 33 is checked. Exactly which portion is to be checked and the length of the portion to be checked may be defined in any manner. It is important that different parts of data 33 be checked in successive power-ups of microcomputer system 33, so that stochastically almost complete test coverage is obtained over time.

In a query block 47, a check is performed to determine whether there has been manipulation of checked data 33. If this is the case, the system branches off to a function block 48, where new data 33 stored in storage assembly 32 is blocked. Data 33 may be blocked in various manners. Various methods are believed to be available from other systems and need not be discussed in detail here. An option is a method in which a portion of data 33 is copied from storage assembly 32 to a volatile memory (e.g. random access memory, RAM) at the beginning of power-up of microcomputer system 30 (function block 41). Copied data 33 is deleted in storage assembly 32 and is copied back out of volatile memory 37 and into the storage area of storage assembly 32 provided if a check of data 33 has shown that data 33 has not been manipulated. However, if data 33 has been manipulated, it remains in the volatile memory and is lost as soon as the power supply is interrupted. Therefore, this achieves an effective manner of blocking data 33 which is difficult to override.

If there has not been any manipulation of data 33, the system branches off to a function block 49 and the exemplary method according to the present invention is terminated. Microcomputer system 30 is powered up again entirely normally and is then operated entirely normally, e.g., for controlling or regulating automotive functions.

What is claimed is:

1. A computer readable medium having a program executable by a processor, comprising:
   a program code for performing a method of protecting a microcomputer system against manipulation of data stored in a storage assembly of the microcomputer system, the method including:
   subdividing the storage assembly into a plurality of logic blocks; and
   at each of a plurality of preselectable points in time:
      selecting only a corresponding subset of the plurality of logic blocks that includes less than all of the data; and
      executing at least one check operation to check for manipulation of only the data of the corresponding subset.

2. The computer readable medium of claim 1, wherein the data stored in the storage assembly includes a control program.

3. The computer readable medium of claim 1, wherein the at least one check operation is executed in powering up the microcomputer system.

4. The computer readable medium of claim 1, wherein the corresponding subset is selected randomly.

5. The computer readable medium of claim 4, further comprising:
   reading a noise signal at an analog/digital input of the microcomputer system;
   generating a random number as a function of the noise signal;
   forming a sum of contents in the storage assembly, the contents being disordered before the microsystem is powered up;
   generating a random number as a function of the sum;
   reading out a status of a timer inside the microcomputer system that is not reset when the microsystem is powered up;
   generating a random number as a function of the status of the timer;
   reading out a variable influenceable by a driver of a vehicle into which the microcomputer system is integrated; and
   generating a random number as a function of the variable.

6. The computer readable medium of claim 1, further comprising:
storing, after executing the at least one check operation, an entry into a storage area of the storage assembly in a write-protected form and one that may not be read out;
erasing the storage area when one of reprogramming and newly programming the storage assembly; and
checking the entry when the microcomputer system is powered up.

7. The method of claim 1, wherein a number and a size of the plurality of logic blocks is selected as a function of at least one of a computing power of a microprocessor of the microcomputer and a size of a storage assembly of the microcomputer.

8. The method of claim 1, wherein at least one of the following is satisfied: (1) the selecting of the corresponding subset is limited to those of the logic blocks in which new data has been stored; and (2) the selecting of the corresponding subset is random.

9. The method of claim 1, wherein different ones of the plurality of logic blocks are checked in successive power-ups of the microcomputer, so that stochastically over time substantially complete test coverage is obtained.

10. The method of claim 1, wherein:
a number and a size of the plurality of logic blocks is selected as a function of at least one of a computing power of a microprocessor of the microcomputer and a size of a storage assembly of the microcomputer;
the selecting of the corresponding subset is limited to those logic blocks in which new data has been stored;
the selecting of the corresponding subset is random; and
different ones of the plurality of logic blocks are checked in successive power-ups of the microcomputer, so that stochastically over time substantially complete test coverage is obtained.

11. A microcomputer system comprising:
a computer;
a storage assembly to store data;
a subdividing arrangement to subdivide the storage assembly into a plurality of logic blocks; and
for protection against manipulation of the data:
a selecting arrangement to select, at each of a plurality of preselectable points in time, only a corresponding subset of the plurality of logic blocks that includes less than all of the data; and
an executing arrangement to execute at least one check operation at each of the preselectable points in time to check for manipulation of only the data of the corresponding subset.

12. The microcomputer system of claim 11, wherein the computer includes a microprocessor.

13. The microcomputer system of claim 11, wherein the data stored in the storage assembly includes a control program.

14. The microcomputer system of claim 11, wherein the microcomputer system is configured as a control device for a motor vehicle for one of controlling and regulating an automotive function.

15. The microcomputer system of claim 11, wherein the storage assembly is arranged on a same semiconductor component as the computer.

16. The microcomputer of claim 11, wherein at least two of the following are satisfied:
a number and a size of the plurality of logic blocks is selected as a function of at least one of a computing power of a microprocessor of the microcomputer and a size of a storage assembly of the microcomputer;
the selecting of the corresponding subset is limited to those logic blocks in which new data has been stored;
the selecting of the corresponding subset is random; and
different ones of the plurality of logic blocks are checked in successive power-ups of the microcomputer, so that stochastically over time substantially complete test coverage is obtained.

17. A microcomputer system comprising:
a computer;
a storage assembly to store data;
a computer readable medium having stored thereon a program executable by the computer, the computer program comprising program code for protecting the microcomputer system against manipulation of the data stored in the storage assembly of the microcomputer system by causing the computer to perform the steps of:
subdividing the storage assembly into a plurality of logic blocks; and
at each of a plurality of preselectable points in time:
selecting only a corresponding subset of the plurality of logic blocks that includes less than all of the data; and
executing at least one check operation to check for manipulation of only the data of the corresponding subset.

18. A memory having stored thereon a computer program executable by a computer, the computer program comprising program code, which when executed by the computer, cause the computer to perform a method for protecting a microcomputer system against manipulation of data stored in a storage assembly of the microcomputer system, the method comprising:
subdividing the storage assembly into a plurality of logic blocks; and
at each of a plurality of preselectable points in time:
selecting only a corresponding subset of the plurality of logic blocks that includes less than all of the data; and
executing at least one check operation to check for manipulation of only the corresponding subset.

19. The computer program of claim 18, wherein at least two of the following are satisfied:
a number and a size of the plurality of logic blocks is selected as a function of at least one of a computing power of a microprocessor of the microcomputer and a size of a storage assembly of the microcomputer;
the selecting of the corresponding subset is limited to those logic blocks in which new data has been stored;
the selecting of the corresponding subset is random; and
different ones of the plurality of logic blocks are checked in successive power-ups of the microcomputer, so that stochastically over time substantially complete test coverage is obtained.

* * * * *